(12) United States Patent
Sun et al.

(10) Patent No.: US 11,807,951 B2
(45) Date of Patent: Nov. 7, 2023

(54) COBALT CHEMISTRY FOR SMOOTH TOPOLOGY

(71) Applicant: MacDermid Enthone Inc., Waterbury, CT (US)

(72) Inventors: Shaopeng Sun, Orange, CT (US); Kyle Whitten, Hamden, CT (US); Stephan Braye, West Haven, CT (US); Elie Najjar, Norwood, MA (US)

(73) Assignee: MacDermid Enthone Inc., Waterbury, CT (US)

( * ) Notice: Subject to any disclaimer, the term of this patent is extended or adjusted under 35 U.S.C. 154(b) by 0 days.

(21) Appl. No.: 17/524,450

(22) Filed: Nov. 11, 2021

(65) Prior Publication Data

US 2022/0136123 A1 May 5, 2022

Related U.S. Application Data

(63) Continuation of application No. 16/713,871, filed on Dec. 13, 2019, now Pat. No. 11,230,778.

(51) Int. Cl.
*C25D 3/16* (2006.01)
*C25D 5/02* (2006.01)
(Continued)

(52) U.S. Cl.
CPC .................. *C25D 3/16* (2013.01); *B32B 3/26* (2013.01); *B32B 15/04* (2013.01); *B32B 15/043* (2013.01);
(Continued)

(58) Field of Classification Search
CPC ... C25D 3/16; C25D 5/02; C25D 5/18; C25D 5/611; C25D 7/00; C25D 7/123; B32B 3/26; B32B 15/04; B32B 15/043; Y10T 428/12931; Y10T 428/12937; Y10T 428/1291; Y10T 428/12993; Y10T 428/24942; Y10T 428/2495; Y10T 428/265

See application file for complete search history.

(56) References Cited

U.S. PATENT DOCUMENTS

| 11,035,048 B2 | 6/2021 | Commander et al. |
| 2002/0053516 A1 | 5/2002 | Basol et al. |

(Continued)

FOREIGN PATENT DOCUMENTS

| WO | 2017004424 A1 | 1/2017 |
| WO | 2019097044 A1 | 5/2019 |

(Continued)

OTHER PUBLICATIONS

Munford, M.L., "Electrodeposition of Magnetic Thin Films of Colbalt on Silicon," Journal of Magnetism and Magnetic Materials, vol. 226-230, May 2001, pp. 1613-1615.

*Primary Examiner* — Michael E. La Villa (57) ABSTRACT

An electroplated cobalt deposit and a method of electrodepositing cobalt on a surface to produce a level deposit across the surface of the substrate. The cobalt electrolyte contains (1) a source of cobalt ions; (2) boric acid; (3) a pH adjuster; and (4) an organic additive, which contains a suppressor. The electroplated cobalt deposit exhibits a level surface such that the thickness difference across substantially the entire surface of the substrate of less than about 200 nm.

16 Claims, 4 Drawing Sheets

(51) Int. Cl.
    *C25D 5/18*     (2006.01)
    *C25D 7/12*     (2006.01)
    *B32B 15/04*     (2006.01)
    *B32B 3/26*     (2006.01)
    *C25D 5/00*     (2006.01)
    *C25D 7/00*     (2006.01)

(52) U.S. Cl.
    CPC ............... *C25D 5/02* (2013.01); *C25D 5/18* (2013.01); *C25D 5/611* (2020.08); *C25D 7/00* (2013.01); *C25D 7/123* (2013.01); *Y10T 428/1291* (2015.01); *Y10T 428/12931* (2015.01); *Y10T 428/12937* (2015.01); *Y10T 428/12993* (2015.01); *Y10T 428/2495* (2015.01); *Y10T 428/24942* (2015.01); *Y10T 428/265* (2015.01)

(56) References Cited

U.S. PATENT DOCUMENTS

| | | | |
|---|---|---|---|
| 2009/0188805 | A1 | 7/2009 | Moffat et al. |
| 2016/0273117 | A1 | 9/2016 | Doubina et al. |
| 2018/0298514 | A1 | 10/2018 | Josell et al. |
| 2019/0010624 | A1 | 1/2019 | Commander et al. |
| 2019/0093248 | A1 | 3/2019 | Josell et al. |
| 2021/0079547 | A1* | 3/2021 | Mevellec .......... H01L 21/76879 |

FOREIGN PATENT DOCUMENTS

| | | | |
|---|---|---|---|
| WO | 2019179897 | A1 | 9/2019 |
| WO | 2019201623 | A2 | 10/2019 |

\* cited by examiner

COBALT CHEMISTRY FOR SMOOTH TOPOLOGY

FIELD OF THE INVENTION

The compositions and processes described herein generally relate to electrolytic deposition chemistry and methods for depositing cobalt and cobalt alloys. These compositions and methods are used for cobalt-based metallization of interconnect features in semiconductor substrates. A screening method for identifying suitable bath additives is also described.

BACKGROUND OF THE INVENTION

In damascene processing, electrical interconnects are formed in an integrated circuit substrate by metal-filling of interconnect features such as vias and trenches, formed in the substrate. Copper is a preferred conductor for electronic circuits. Unfortunately, when copper is deposited on silicon substrates it can diffuse rapidly into both the substrate and dielectric films (such as $SiO_2$ or low k dielectrics). Copper also has a tendency to migrate from one location to another when electrical current passes through interconnect features in service, creating voids and hillocks. Copper can also diffuse into a device layer that is built on top of a substrate in a multilayer device application. Such diffusion can be detrimental to the device because it can damage an adjacent interconnect line and/or cause electrical leakage between two interconnects. Electrical leakage can result in an electrical short and the corresponding diffusion out of the interconnect feature can disrupt electrical flow.

Along with the reduction in size and desired increase in the performance of electronic devices, the demand for defect free and low resistivity interconnects in the electronic packaging industry has become critical. As the density of an integrated circuit within a microelectronic device continues to increase with each generation or node, interconnects become smaller and their aspect ratios generally increase. The build-up process, using barrier and seed layers, prior to damascene copper electroplating, now suffers from disadvantages that are becoming more evident as the demand for higher aspect ratio features and higher quality electronic devices increases. As a result, there is a need for more suitable plating chemistry to enable defect free metallization.

When submicron vias and trenches are filled by electrolytic deposition of copper, it is generally necessary to first deposit a barrier layer on the walls of the cavity to prevent the diffusion and electromigration of copper into the surrounding silicon or dielectric structure. In order to establish a cathode for the electrodeposition, a seed layer is deposited over the barrier layer. Barrier and seed layers can be very thin, especially where the electroplating solution contains a proper formulation of accelerators, suppressors, and levelers. However, as the density of electronic circuitry continues to increase, and the entry dimensions of vias and trenches become ever smaller, even very thin barrier and seed layers progressively occupy higher fractions of the entry dimensions. As the apertures reach dimensions below 50 nm, especially less than 40 nm, 30 nm, 20 nm, or even less than 10 nm (8 or 9 nm), it becomes increasingly difficult to fill the cavity with a copper deposit that is entirely free of voids and seams. The most advanced features have bottom widths of only 2-3 nm, a middle width of about 4 nm, and a depth of 100 to 200 nm, translating to an aspect ratio of between about 25:1 and about 50:1.

Electrolytic deposition of cobalt is performed in a variety of applications in the manufacture of microelectronic devices. For example, cobalt is used in capping of damascene copper metallization employed to form electrical interconnects in integrated circuit substrates. However, because cobalt deposits have higher resistivity, such processes have not previously offered a satisfactory alternative to electrodeposition of copper in filling vias or trenches to provide the primary interconnect structures. In a typical semiconductor process, a chemical-mechanical polishing/planarization (CMP) step follows electrodeposition in order to polish off overplated deposit or overburden. Rough or uneven surfaces can cause defects from CMP, so it is critical to have a smooth topology for overburden. In addition, rough or uneven surfaces can be especially problematic due to the difference in overburden (OB) thickness between feature and non-feature areas, which is normally expected due to momentum plating. This difference in overburden thickness can be further enhanced with the density of features.

U.S. Pat. Pub. No. 2016/0273117 to Doubina, the subject matter of which is herein incorporated by reference in its entirety, describes methods and apparatus for electroplating cobalt on a substrate in which electroplating may occur through a bottom-up mechanism. Doubina uses various plating additives, including particular combinations of accelerators and suppressors and particular conductivity to achieve desired plating results. However, Doubina does not mention the desirability of minimizing changes in overburden thickness between feature areas and non-feature areas of the substrate nor does Doubina describes any method of evaluating the effectiveness of bath additives in a cobalt electrolyte to achieve a desired result.

U.S. Pat. Pub. No. 2009/0188805 to Moffat et al., the subject matter of which is herein incorporated by reference in its entirety, describes a method of electrodepositing at least one ferromagnetic material, which may be nickel, cobalt, or iron, into a three dimensional pattern within a substrate. Moffat describes controlling the potential between an electrode and a counter electrode, but does not describe any way to evaluate the effectiveness of bath additives.

U.S. Pat. Pub. No. 2019/0010624 to Commander et al., the subject matter of which is herein incorporated by reference in its entirety, describes compositions and methods of using such compositions for electrodepositing cobalt onto semiconductor base structures comprising submicron-sized electrical interconnect features. The interconnect features are metallized by contacting the semiconductor base structure with a cobalt electrolytic composition and an electrical current is supplied to the electrolytic composition to deposit cobalt onto the base structure and fill the submicron-sized features with cobalt.

U.S. Pat. Pub. No. 2019/0093248 to Josell et al., the subject matter of which is herein incorporated by reference in its entirety, describes superconformally filling a recessed feature with superconformally deposited gold. However, the process in Josell is directed to the so-called "coinage metals" of gold, silver, and copper, which use very different additives than a cobalt plating bath. While Josell describes electrochemical measurements, Josell does not mention the desirability of minimizing changes in overburden thickness between feature areas and non-feature areas of the substrate, nor does Josell contemplate how to evaluate the effectiveness of various bath additives.

Thus, it can be seen that it would be desirable to provide a method of evaluating bath additives for use in a cobalt electroplating baths to produce a desirable result.

To that end, the inventors of the present invention have surprisingly discovered that cyclic voltammetry can be used to analyze and/or screen additives for use in cobalt electroplating compositions and to determine additives that are capable of producing a suitable/desired result.

Cyclic Voltammetry can be used to study qualitative information about electrochemical processes under various conditions, and to determine the electron stoichiometry of a system, the diffusion coefficient of an analyte, and the formal reduction potential, which can be used as an identification tool. In addition, CV can be used to determine the concentration of an unknown solution by generating a calibration curve of current vs. concentration.

Cyclic voltammetry (CV) is a potentiodynamic electrochemical measurement that can be used to probe reactions involving electron transfers. In a cyclic voltammetry experiment, the working electrode potential is ramped linearly versus time in cyclic phases. During the initial forward scan (from $t_0$ to $t_1$) an increasingly reducing potential is applied. Thus, the cathodic current will, at least initially, increase over this time period assuming that there are reducible analytes in the system. At some point after the reduction potential of the analyte is reached, the cathodic current will decrease as the concentration of reducible analyte is depleted. If the redox couple is reversible then during the reverse scan (from $t_1$ to $t_2$) the reduced analyte will start to be re-oxidized, giving rise to a current of reverse polarity (anodic current) to before. The more reversible the redox couple is, the more similar the oxidation peak will be in shape to the reduction peak. Thus, cyclic voltammetry can provide information about redox potentials and electrochemical reaction rates.

The rate of voltage change over time during each of these phases is known as the experiment's scan rate (V/s). The potential is measured between the working electrode and the reference electrode, while current is measured between the working electrode and the counter electrode. These data are plotted as current (i) versus applied potential (E, often referred to as just "potential").

After the set potential is reached in a CV experiment, the working electrode's potential is ramped in the opposite direction to return to the initial potential. These cycles of ramps in potential may be repeated as many times as needed.

SUMMARY OF THE INVENTION

It is an object of the present invention to provide a cobalt deposit that exhibits smooth topology for overburden.

It is another object of the present invention to minimize the change in overburden thickness between feature and non-feature areas.

It is another object of the present invention to provide a void-free cobalt deposit.

It is still another object of the present invention to minimize impurities in the cobalt electrodeposit.

It is still another object of the present invention to provide a screening method to evaluation the effectiveness of various bath additives for use in a cobalt electroplating bath.

To that end, in one embodiment, the present invention relates generally to an electroplated cobalt deposit on a surface of a substrate, wherein the electroplated cobalt deposit exhibits a thickness difference across substantially the entire surface of the substrate of less than about 200 nm.

In another embodiment, the present invention relates generally to a method of electrodepositing cobalt onto a substrate comprising recessed features and non-feature areas, wherein the cobalt deposit exhibits a thickness difference across substantially the entire surface of the substrate of less than about 200 nm the method comprising:
 a) receiving the substrate in an electroplating chamber;
 b) immersing the substrate into a cobalt electrolyte, the cobalt electrolyte comprising:
  (1) a source of cobalt ions;
  (2) boric acid;
  (3) a pH adjuster; and
  (4) an organic additive, wherein the organic additive comprises a suppressor; and
 c) electroplating cobalt into the features and onto the onto the non-feature areas for a period of time and under conditions to achieve a level, seam-free, bottom-up fill in the recessed features and plating on the non-feature areas.

DETAILED DESCRIPTION OF THE PREFERRED EMBODIMENTS

"A," "an," and "the" as used herein refer to both singular and plural referents unless the context clearly dictates otherwise.

As used herein, the term "about" refers to a measurable value such as a parameter, an amount, a temporal duration, and the like and is meant to include variations of +/−15% or less, preferably variations of +/−10% or less, more preferably variations of +/−5% or less, even more preferably variations of +/−1% or less, and still more preferably variations of +/−0.1% or less of and from the particularly recited value, in so far as such variations are appropriate to perform in the invention described herein. Furthermore, it is also to be understood that the value to which the modifier "about" refers is itself specifically disclosed herein.

As used herein, spatially relative terms, such as "beneath". "below", "lower", "above", "upper" and the like, are used for ease of description to describe one element or feature's relationship to another element(s) or feature(s) as illustrated in the figures. It is further understood that the terms "front" and "back" are not intended to be limiting and are intended to be interchangeable where appropriate.

As used herein, the terms "comprises" and/or "comprising," specify the presence of stated features, integers, steps, operations, elements, and/or components, but do not preclude the presence or addition of one or more other features, integers, steps, operations, elements, components, and/or groups thereof.

As used herein the term "substantially-free" or "essentially-free" if not otherwise defined herein for a particular element or compound means that a given element or compound is not detectable by ordinary analytical means that are well known to those skilled in the art of metal plating for bath analysis. Such methods typically include atomic absorption spectrometry, titration, UV-Vis analysis, secondary ion mass spectrometry, and other commonly available analytically methods.

In one embodiment, the present invention relates generally to an electroplated cobalt deposit on a surface of a substrate, wherein the electroplated cobalt deposit exhibits a thickness difference across substantially the entire surface of the substrate of less than about 200 nm.

In another embodiment, the present invention relates generally to a method of electrodepositing cobalt onto a substrate comprising recessed features and non-feature areas, wherein the cobalt deposit exhibits a thickness difference across substantially the entire surface of the substrate of less than about 200 nm the method comprising:
a) receiving the substrate in an electroplating chamber;
b) immersing the substrate into a cobalt electrolyte, the cobalt electrolyte comprising:
(1) a source of cobalt ions;
(2) boric acid;
(3) a pH adjuster; and
(4) an organic additive, wherein the organic additive comprises a suppressor; and
(5) optionally, one or more additional bath additives; and
c) electroplating cobalt into the features and onto the onto the non-feature areas for a period of time and under conditions to achieve a level, seam-free, bottom-up fill in the recessed features and plating on the non-feature areas.

The source of cobalt ions may be selected from the group consisting of cobalt sulfate, cobalt chloride, chloride sulfamate, and combinations of one or more of the foregoing. In one embodiment, the source of cobalt ions comprises cobalt sulfate heptahydrate.

In a preferred embodiment, the cobalt electroplating composition is at least substantially free of other metal ions, meaning that the content of other metal ions is less than about 1% by weight. more preferably less than 0.1% by weight, most preferably less than about 0.01% by weight. Most preferably, the cobalt electroplating composition is free of any metal ions except cobalt ions.

Based thereon, the cobalt electroplating composition is preferably at least substantially free of copper ions. Although very minor copper contamination may be difficult to avoid, it is particularly preferred that the copper ion content of the bath is no more than 20 ppb. e.g., in the range of 0.1 ppb to 20 ppb. In compositions defined herein, "substantially free of copper ions" means that there are less than 20 ppb copper ions in solution.

The cobalt ion concentration in the electroplating solution is typically in the range of about 1 and about 50 g/L, preferably about 2 to about 25 g/L, more preferably about 2 to about 10 g/L, more preferably about 2 to about 5 g/L.

The electrolytic cobalt composition, also optionally, but preferably comprises a buffer to stabilize the pH. One preferred buffer is boric acid ($H_3BO_3$), which may be incorporated into the composition in a concentration between about 5 and about 50 g/L, preferably between about 15 and about 40 g/L. The pH of the composition is preferably maintained in the range of about 0.5 to about 8. In one embodiment, the pH of the cobalt composition is preferably maintained in a range of less than 5, more preferably in a range of about 1 to about 5, more preferably in a range of about 2 to about 4.5, and most preferably within a range of about 2.5 to about 4.

The composition comprises one or more suppressor compounds. In one embodiment, the one or more suppressor compounds comprise acetylenic alcohol compounds or derivatives thereof as further described herein. The concentration of the suppressor is preferably between about 1 and about 500 mg/L, and more preferably between about 5 and about 200 mg/L. more preferably between about 1 mg/L and about 70 mg/L, and most preferably between about 20 and about 50 mg/L.

The composition may also optionally comprise one or more uniformity enhancing compounds which preferably comprise aminic polyol compounds or derivatives thereof. A preferred uniformity enhancer is ethoxylated, propoxylated triisopropanolamine. In one embodiment, the uniformity enhancer has a molecular weight of about 5000 g/mol. Other preferred uniformity enhancing compounds include ethoxylated, propoxylated ethylene diamine, ethoxylated, propoxylated diethylene triamine and ethoxylated, propoxylated triethylenetetramine. If used, the concentration of the uniformity enhancer is preferably between about 10 and about 4000 mg/L, and more preferably between about 100 and about 2000 mg/L, and most preferably between about 250 and about 1000 mg/L.

The composition may also optionally comprise one or more depolarizing compounds. In one embodiment the one or more depolarizing compounds comprises terminal unsaturated compounds or derivatives thereof, which are capable of depolarizing the plating potential. In one embodiment, the depolarizing compound may be selected from the group consisting of sodium propargyl sulfonate, acetylenedicarboxylic acid, acrylic acid, propiolic acid, vinyl phosphonate, and mixtures thereof. One preferred depolarizing compound is sodium propargyl sulfonate. If used, the concentration of the depolarizing compound is preferably between about 0.1 and about 5000 mg/L. and more preferably between about 10 and about 1000 mg/L, and most preferably between about 100 and about 500 mg/L.

In one embodiment, the cobalt electrolyte composition is essentially free of chloride ions, meaning that the chloride content is less than about 1 ppm, more preferably less than 0.1 ppm.

The electroplating composition is also preferably free of any functional concentration of reducing agents effective to reduce cobaltous ions ($Co^{2+}$) to metallic cobalt ($Co^0$). By "functional concentration" what is meant is any concentration of a reducing agent that is either effective to reduce cobaltous ions in the absence of electrolytic current or is activated by an electrolytic field to react with cobaltous ions.

In addition, the electroplating composition is preferably at least essentially free of dispersed particles, meaning that there are no or virtually none macroscopic particulate solids in the solution that are dispersed and would negatively interfere with the metal electroplating process.

In another preferred embodiment, the cobalt composition also optionally, but preferably. comprises one or more levelers, one or more accelerators and/or one or more wetting agents. In other preferred embodiments the cobalt composition does not contain and is preferably at least substantially free of an accelerator or a depolarizer. In other preferred embodiments, the cobalt composition does not contain and is preferably at least substantially free of a leveler.

When divalent sulfur compounds are excluded from the plating bath, the sulfur content of the cobalt deposit is lowered, providing beneficial effects in chemical mechanical polishing and circuit performance.

The electrolytic composition is substantially free of divalent sulfur compounds if the concentration of divalent sulfur in the plating solution is not greater than 1 mg/l. Preferably, the concentration of compounds containing divalent sulfur atoms is not greater than 0.1 mg/l. Still more preferably, the concentration of divalent sulfur atoms is below the detection level using analytical techniques common to those skilled in the art of metal plating.

To reduce internal stress in the cobalt deposit, the electrolytic composition can include a stress reducer such as saccharin. When used, saccharin is present in the electrolytic composition in a concentration between about 10 and about 300 ppm, more preferably between about 100 and about 200 ppm.

When the plating bath contains a suppressor as described herein and optionally a uniformity enhancer, the superfilling process proceeds satisfactorily without the need for an accelerator. The suppressors in the current invention help drive current into the features to make bottom-up filling efficient and the uniformity enhancing additives help improve deposit uniformity. The composition is substantially free of reducing agents that reduce $Co^{2+}$ to $Co^0$, divalent sulfur, copper ions, nickel ions and iron ions.

It has also been found that certain depolarizing compounds can function in conjunction with the suppressor compounds as described herein. These compounds depolarize the plating potential to efficiently plate interconnect features.

In one embodiment, the suppressor is an acetylenic suppressor. The acetylenic suppressor preferably comprises a reaction product of an alkoxylated propargyl alcohol or propargyl alcohol with a second component. Examples of suitable acetylenic suppressors include, but are not limited to, reaction products of alkoxylated propargyl alcohol or propargyl alcohol with glycidol, propylene oxide, glycidol and propylene oxide, or propylene glycol and glycidol. In one embodiment, the alkoxylated propargyl alcohol is ethoxylated propargyl alcohol. However, it is also contemplated that other alkoxylated propargyl alcohols would also be used in the compositions described herein. Examples of initiators and reacting species for preparing acetylenic suppressors in accordance with the present invention are shown below in Table 1.

TABLE 1

Initiators and reacting species for use in preparing aceiyienic suppressors

Initiators

TABLE 1-continued

Initiators and reacting species for use in preparing aceiyienic suppressors

Reacting species

In one embodiment. x and y are between 0 and 20, more preferably between 0 and 10. In another preferred embodiment, one of x or y is at least 1. Examples of preferred ratios included, but are not limited to:

x is 0, y is 1 to 3;

y is o and x is 1 to 7; and x is 1-4 and y is 1-4.

Other ratios of x and y would also be known to those skilled in the art and are usable in the present invention.

Table 2 depicts several examples of preferred acetylenic suppressors in accordance with the present invention and as formulated using the initiators and reacting species described herein.

TABLE 2

Preferred specific acetylenic suppressors

Ethoxylated propargyl alcohol + glycidol
(Compound 1)

Ethoxylated propargyl alcohol + propylene
oxide (Compound 2)

Ethoxylated propargyl alcohol + glycidol +
propylene oxide (Compound 3)

ethoxylated propargyl alcohol + propylene
oxide + glycidol (Compound 4)

In one embodiment, n is between 0 and 20, more preferably between 0 and 10. most preferably between 1 and 7.

The electrolytic composition described herein can be used in a method for filling submicron features of a semiconductor base structure A submicron electrical interconnect feature has a bottom, sidewalls, and top opening. The submicron features comprise cavities in the base structure that are superfilled by rapid bottom-up deposition of cobalt. A metallizing substrate comprising a seminal conductive layer is formed on the internal surfaces of the submicron features, e.g., by physical vapor deposition of metal seed layer, preferably a cobalt metal seed layer, or deposition of a thin conductive polymer layer. The metallizing substrate is applied to the bottom and sidewall, and typically to the field surrounding the feature. The metallizing substrate within the feature is contacted with the electrolytic composition and current is supplied to the electrolytic composition to cause electrodeposition of cobalt that fills the submicron features. By co-action of the suppressor, optional uniformity enhancer, and optional depolarizing compound, a vertical polarization gradient is formed in the feature in which filling will occur by bottom up deposition at a rate of growth in the vertical direction which is greater than a rate of growth in the horizontal direction, yielding a cobalt interconnect that is substantially free of voids and other defects.

Bottom-up fill means that deposit grows up from the bottom of features, like a trench. Bottom-up fill can be classified as V or U shaped. A V-shape bottom-up has a pointer bottom, and a U-shape bottom-up has more leveled bottom. U-shape bottom-up filling is preferred, as V-shape bottom-up filling can generate seams. Conformal fill means that a deposit grows from sidewalls and bottom to the center of features. The most challenging features usually have very large aspect ratios (aspect ratio is the ratio of depth over width), and conformal fill typically makes a seam at the center of such features. A seam can be vague or clear depending on fill mechanism. However, after annealing, any seam can make seam voids or center voids.

What is meant by "substantially void free" is that at least 95% of the plated features or apertures are void-free. Preferably, at least 98% of the plated features or apertures are void-free, most preferably all of the plated features or apertures are void-free.

What is meant by "substantially seam-free" is that is that at least 95% of the plated features or apertures are seam-free. Preferably, at least 98% of the plated features or apertures are seam-free, most preferably all of the plated features or apertures are seam-free.

To implement the electrodeposition method, an electrolytic circuit is formed comprising the metallizing substrate, an anode, the aqueous electrolytic composition, and a power source having a positive terminal in electrically conductive communication with the anode and a negative terminal in electrically conductive communication with the metallizing substrate. Preferably, the metallizing substrate is immersed in the electrolytic composition. An electrolytic current is delivered from the power source to the electrolytic composition in the circuit, thereby depositing cobalt on the metallizing substrate.

The electrodeposition process is preferably conducted at a bath temperature in the range of about 5° C. to about 80° C., more preferably between about 20° C. and about 50° C., most preferably at about room temperature, and a current density in the range between about 0.01 and about 20 mA/cm$^2$, preferably between about 0.3 and about 10 mA/cm$^2$. Optionally. the current may be pulsed, which can provide improvement in the uniformity of the deposit. On/off pulses and reverse pulses can be used.

Typically, the electroplating bath is agitated during use. Any suitable agitation method may be used with the process described herein including sparging with air or inert gas, workpiece agitation, impingement, or the like. In addition, the workpiece may be rotated in the electroplating solution. Alternatively, instead of immersing the workpiece into the electroplating solution, the workpiece maybe contacted with the electroplating solution by pumping, spraying or other means known to those skilled in the art.

The present invention also relates generally to a screening method for evaluating the suitability of bath additives for cobalt electroplating compositions.

As discussed above, rough or uneven surfaces can cause defects from chemical mechanical polishing (CMP), so it is critical to have a smooth topology for overburden. In addition, rough or uneven surfaces can be especially problematic due to the difference in overburden (OB) thickness between feature and non-feature areas, which is normally expected due to momentum plating. This difference in overburden thickness can be further enhanced depending in part on the density of features.

Thus, it would be desirable to have a reliable screening method for evaluating potential cobalt electroplating compositions and additives contained therein to determine their suitability in producing a cobalt deposit with minimal change in overburden thickness between feature and non-feature areas of a substrate.

As described herein, the inventors of the present invention have surprisingly discovered that cyclic voltammetry can be used to evaluate cobalt electroplating compositions containing various bath additives. The present invention contemplates an electrochemical screening method using cyclic voltammetry to evaluate cobalt electroplating compositions.

In the cyclic voltammetric scan, the forward scan represents non-feature areas of plating and the backward scan represents feature areas of the plating. The potential difference between the forward scan and backward scan is referred to herein as the "hysteresis loop." A larger hysteresis loop means a larger potential difference and vice versa. In addition, the size of the hysteresis loop can vary with the current density.

The inventors of the present invention have discovered that a cobalt electroplating composition that exhibits a small hysteresis loop at high current density has a positive impact on overburden topography. The hysteresis loop at the high current density for OB, which is generally at least about 5 mA/cm$^2$, can have a negative impact on OB topology. The inventors of the present invention have discovered that a clear correlation exists between the hysteresis loop at high current density and OB topology. It was found that a larger hysteresis loop can lead to a larger difference in OB thickness between feature and non-feature areas, which can cause defects in CMP and thus is not preferred for CMP.

In one embodiment, the hysteresis loop at high current density is less than 50 mV, preferably less than 40 mV, more preferably less than 30 mV, more preferably less than 20 mV, most preferably less than 10 mV. By high current density what is meant is a current density that is in the range of at least about 5 mA/cm$^2$, preferably in the range of about 5 to about 10 mA/cm$^2$, more preferably in the range of about 7.5 to about 8.5 mA/cm$^2$ and most preferably at about 8 mA/cm$^2$. In one embodiment, it is desirable that the hysteresis loop at a current density of about 8 mA/cm$^2$ be less than about 50 mV, preferably, less than about 40 mV, more preferably less than about 30 mV.

It has also been observed that most of the chemistry of good gap fill performance has a hysteresis loop at low current density, although there is no clear correlation that a larger hysteresis loop can make gap fill better.

It is highly desirable that the change in overburden thickness between feature and non-feature areas. In one embodiment, the change in overburden thickness is controlled to be less than 50 nm, more preferably less than 40 nm, or less than 35 nm, or less than 30 nm, or less than 20 nm, or less than 10 nm.

TABLE 3

Hysteresis Loop and Overburden Thickness Difference

| Chemistry | Hysteresis Loop, mV | | OB Thickness Difference between feature and non-feature area, nm |
|---|---|---|---|
| | At 2 mA/cm$^2$ | At 8 mA/cm$^2$ | |
| Comparative Example 1 | 82 | 55 | 83 |
| Example 2 | 81 | 33 | 52 |
| Example 3 | 88 | 41 | 41 |

Plating Experimental:
Temperature—room temperature
Waveform:
OCP followed by 0.5 to 2 mA/cm$^2$ ramp current for the amount time needed to complete via fill; then 8 mA/cm$^2$ for the amount of time required to obtain desired overburden thickness.

Comparative Example 1

An aqueous cobalt electroplating bath was prepared containing 2.95 g/L Co$^{2+}$ ions, 30 g/L boric acid, and sulfuric acid to adjust pH to 2.75. Ethoxylated propargyl alcohol (40 mg/L) and an aminic polyol with MW around 5000 (50 mg/L) are also added to the composition.

A substrate with submicron features is placed into the bath and electroplated from 0.5 to 8 mA/cm$^2$ to provide seam-free fill with over burden. A cyclic voltammetric scan was performed using the waveform described above to measure hysteresis loop.

The OB thickness difference (uniformity) and CV hysteresis loop measurements are described in Table 3 and that film impurities are summarized in Table 4.

Example 2

An aqueous cobalt electroplating bath was prepared containing 2.95 g/L Co$^{2+}$ ions, 30 g/L boric acid, and sulfuric acid to adjust pH to 2.75. Compound I (See Table 2, x=3.6), was added to the bath at a concentration of 240 mg/L.

A substrate with submicron features is placed into the bath and electroplated from 0.5 to 8 mA/cm$^2$ to provide seam-free fill with over burden. A cyclic voltammetric scan was performed using the waveform described above to measure the hysteresis loop.

The OB thickness difference (uniformity) and CV hysteresis loop measurements are described in Table 3 and that film impurities are summarized in Table 4.

Example 3

An aqueous cobalt electroplating bath was prepared containing 2.95 g/L Co$^{2+}$ ions, 30 g/L boric acid, and sulfuric acid to adjust pH to 2.75. Compound III (See Table 2. x=3.6 and y=1), was added to the bath at a concentration of 240 mg/L.

A substrate with submicron features is placed into the bath and electroplated from 0.5 to 8 mA/cm$^2$ to provide seam-free fill with over burden. A cyclic voltammetric scan was performed using the waveform described above to measure the hysteresis loop.

The OB thickness difference (uniformity) and CV hysteresis loop measurements are described in Table 3 and that film impurities are summarized in Table 4.

Figure 1:
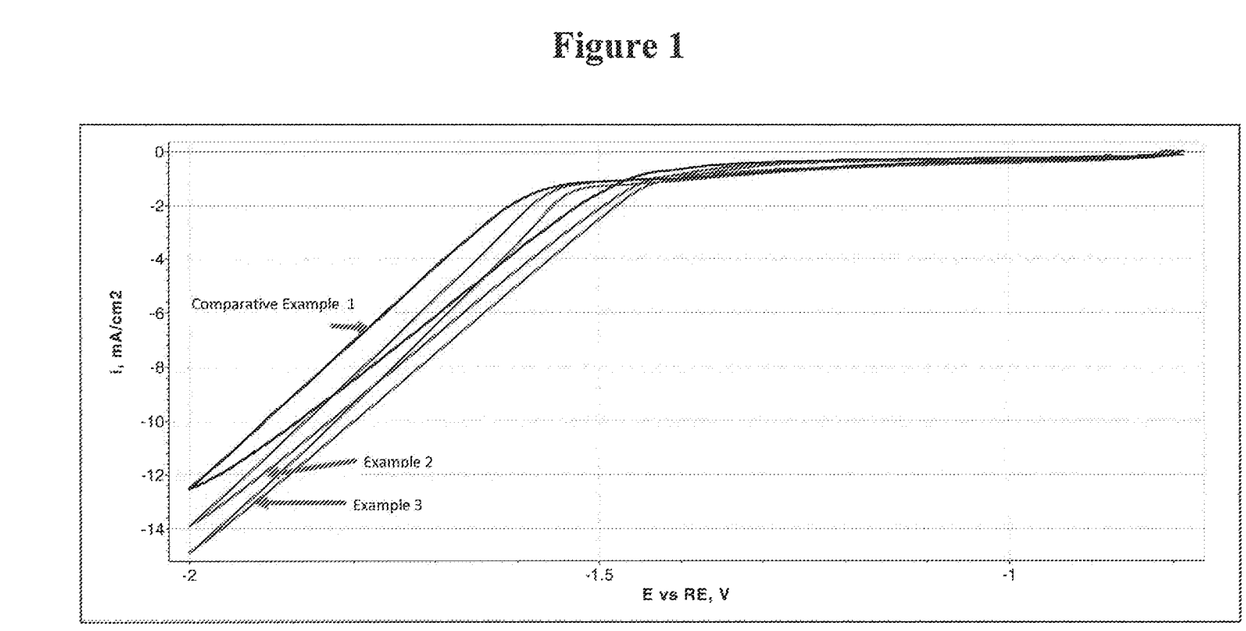
FIG. 1 depicts a Cyclic Voltammetry curves of Comparative Example 1, Example 2, and Example in accordance with the present invention.
Figure 2:
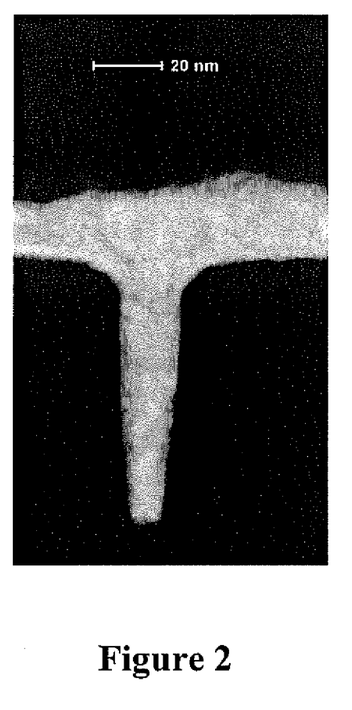
FIG. 2 depicts a photograph of a cobalt deposit as set forth in Comparative Example 1.
Figure 3:
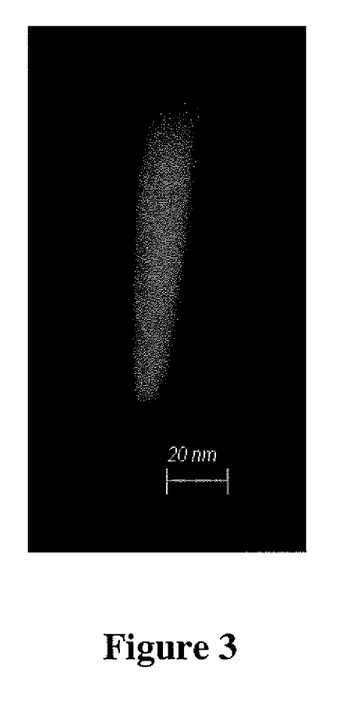
FIG. 3 depicts a photograph of a cobalt deposit as set forth in Example 2.
Figure 4:
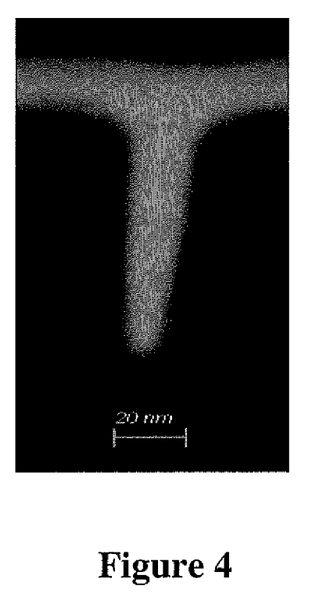
FIG. 4 depicts a photograph of a cobalt deposit as set forth in Example 3.

FIG. 1 depicts a Cyclic Voltammetry (CV) scan from +10 mV vs OCP to −2V vs RE at 2 mV/s with 100 rpm for Comparative Example 1, Example 2 and Example 3.

TABLE 4

Film Impurities in Examples

| | Impurities, PPMW | | | | |
|---|---|---|---|---|---|
| Chemistry | C | S | Cl | N | Total |
| VMS Only | 28.5 | 0.5 | 0.2 | 0.2 | 29.4 |
| Comparative Example 1 | 232.4 | 3.2 | 0.1 | 0.5 | 236.2 |
| Example 2 | 275.2 | 0.5 | 0.3 | 0.2 | 276.2 |
| Example 3 | 87.9 | 0.3 | 0.3 | 0.3 | 88.8 |

As shown in FIG. 1, hysteresis loop is the potential difference between forward and backward scan at the same current density. At low current density, hysteresis loop represents gap fill capability; and at high current density, hysteresis loop represents the performance of OB ISO/Dense uniformity. The hysteresis loop of curves in FIG. 1 is summarized in Table 3. It is noted that 2 mA/cm$^2$ represents low current density; and 8 mA/cm$^2$ represents high current density.

In addition, in Table 3, the last column summarizes OB thickness difference between feature and non-feature area using the internal testing structure described herein. This internal testing structure is referred to as "454." The feature area of the test structure has a trench of 0.1 um opening with 0.1 um spacing, and is considered a dense feature. The non-feature area is the area next to the feature area. The OB thickness difference can represent OB ISO/Dense uniformity performance. The smaller difference means better OB ISO/Dense uniformity performance. In Table 3, it is clear that Comparative Example 1 exhibits a large hysteresis loop at 8 mA/cm$^2$ has larger OB thickness difference than Examples 2 and 3 which have small hysteresis loop at 8 mA/cm$^2$.

It is believed that the hysteresis loop at low current density can represent gap fill capability. In other words, if two chemistry having similar hysteresis loop at low current density should be able to deliver similar gap fill performance. In one embodiment, the plated cobalt deposit exhibits a potentiodynamically measured hysteresis loop in a cyclic voltammetry scan at a current density in the range of about 1 to less than 5 mA/cm$^2$, more preferably in the range of about 1.5 to about 2.5 mA/cm$^2$, of less than about 90 mV. In Table 3, it is clear that Comparative Example 1. Example 2, and Example 3 all have similar hysteresis loop at low current density, 2 mA/cm$^2$, and it is observed that they have similar gap fill performance in TEM or STEM.

The idea of hysteresis loop theory is to have a chemistry which can have large hysteresis loop at low current density and small hysteresis loop at high current density to achieve both good gap fill and OB ISO/Dense uniformity at the same time Table 4 summarizes SIMS (secondary ion mass spectrometry) data and demonstrates the impurity level in deposit. The goal of this study is to achieve as little impurity in deposit as possible. Ideally the same as VMS only, or less. At the unique molecular structure of Example 2, it can have much less impurity than the other chemistry, and it can still deliver proper gap fill performance.

Based thereon, it can be seen that a smaller hysteresis loop at 8 mA/cm$^2$ where OB is plated can lead to less difference in OB thickness between feature and non-feature areas.

This observation can also be supported by theory. Momentum plating is expected on feature areas. This means that the feature area has a faster deposit growth rate than non-feature areas. The adsorbed acetylenic suppressor on feature area surfaces is also expected to be less than non-feature areas due to more fresh deposit surface. At the forward scan part, the potential is canned from low to high and at the backward scan part, the potential is scanned from high to low. So, more fresh deposit surface is expected to be formed during the forward scan. As a result, in the CV scan, the forward scan represents non-feature area plating and the backward scan represents feature area plating.

In the CV curve, at the same current density, when the forward scan is more cathodic than the backward scan, this is an indication that it takes more energy to grow on non-feature areas than on feature areas. In other words, the growth of the deposit on feature areas is enhanced, which can cause a difference in deposit thickness between feature and non-feature areas. This is the fundamental reason why minimizing the hysteresis loop at the current density where the OB is plated is critical to reduce the difference in deposit thickness between feature and non-feature areas.

Thus it can be seen that the invention described herein provides an improved method and composition for cobalt-based metallization of interconnect features in semiconductor substrates. In addition, the invention described herein provides a screening method for evaluating and identifying suitable bath additives to achieve a desired result.

Finally, it should also be understood that the following claims are intended to cover all of the generic and specific features of the invention described herein and all statements of the scope of the invention that as a matter of language might fall there between.

What is claimed is:

1. An electroplated cobalt deposit on a surface of a substrate, wherein the cobalt deposit electroplated on the surface of the substrate comprises sub-micron recessed features and non-feature areas and the cobalt deposit exhibits a level, seam-free bottom-up fill in the submicron recessed features and plating on the non-feature areas, wherein a change in overburden thickness between the sub-micron recessed features and the non-feature areas is less than about 50 nm, wherein the cobalt deposit exhibits a potentiodynamically measured hysteresis loop in a cyclic voltammetry scan at a current density in the range of about 5 to about 10 mA/cm$^2$ of less than about 50 mV,
   wherein the electroplated cobalt deposit is formed by immersing the substrate into a cobalt electrolyte comprising:
   1) a source of cobalt ions;
   2) boric acid;
   3) a pH adjuster;
   4) an organic additive, wherein said organic additive comprises a reaction product of an alkoxylated propargyl alcohol or propargyl alcohol with a second component, wherein the second component comprises glycidol, propylene oxide, glycidol and propylene oxide, or propylene glycol and glycidol;
   wherein the cobalt electrolyte is at least essentially free of chloride ions;
   wherein the cobalt electrolyte is at least substantially free of an accelerator;
   wherein the cobalt electrolyte contains less than 0.1 mg/L of divalent sulfur compounds.

2. The electroplated cobalt deposit according to claim 1, wherein the potentiodynamically measured hysteresis loop in the cyclic voltammetry scan at the current density in the range of 5 to about 10 mA/cm² is less than about 30 mV.

3. The electroplated cobalt deposit according to claim 2, wherein the potentiodynamically measured hysteresis loop in the cyclic voltammetry scan at the current density in the range of 5 to about 10 mA/cm² is less than about 20 mV.

4. The electroplated cobalt deposit according to claim 3, wherein the potentiodynamically measured hysteresis loop in the cyclic voltammetry scan at the current density in the range of 5 to about 10 mA/cm² is less than about 10 mV.

5. The electroplated cobalt deposit according to claim 1, wherein the current density at which the hysteresis loop is measured is in the range of about 7.5 to about 8.5 mA/cm².

6. The electroplated cobalt deposit according to claim 5, wherein the current density at which the hysteresis loop is measured is about 8 mA/cm².

7. The electroplated cobalt deposit according to claim 1, wherein the plated cobalt deposit exhibits a potentiodynamically measured hysteresis loop in a cyclic voltammetry scan at a current density in the range of about 1 to less than 5 mA/cm² of less than about 90 mV.

8. The electroplated cobalt deposit according to claim 7, wherein the current density at which the hysteresis loop is measured is in the range of about 1.5 to about 2.5 mA/cm².

9. The electroplated cobalt deposit according to claim 8, wherein:
the cobalt deposit exhibits a potentiodynamically measured hysteresis loop in a cyclic voltammetry scan at a current density in the range of about 7.5 to about 8.5 mA/cm² of less than about 50 mV.

10. The electroplated cobalt deposit according to claim 9, wherein in the cyclic voltammetry scan, a forward scan represents non-feature area plating and the backward scan represents feature area plating of the cobalt deposit.

11. The electroplated cobalt deposit according to claim 1, wherein the cobalt electrolyte is at least substantially free of a depolarizer.

12. The electroplated cobalt deposit according to claim 1, wherein the cobalt deposit is at least essentially free of chloride.

13. The electroplated cobalt deposit according to claim 12, wherein the cobalt deposit contains less than 0.3 ppmw chloride as measured by secondary ion mass spectroscopy.

14. An electroplated cobalt deposit on a surface of a substrate, wherein the cobalt deposit electroplated on the surface of the substrate comprises sub-micron recessed features and non-feature areas and the cobalt deposit exhibits a level, seam-free bottom-up fill in the sub-micron recessed features and plating on the non-feature areas in which a change in over thickness between the sub-micron recessed features and the non-feature areas is less than about 50 nm, wherein the cobalt is electroplated by immersing the substrate into a cobalt electrolyte consisting essentially of:
(1) a source of cobalt ions;
(2) boric acid;
(3) a pH adjuster; and
(4) an organic additive, wherein said organic additive comprises a reaction product of an alkoxylated propargyl alcohol or propargyl alcohol with a second component, wherein the second component comprises glycidol, propylene oxide, glycidol and propylene oxide, or propylene glycol and glycidol;
wherein the cobalt electrolyte is at least substantially free of an accelerator:
wherein the cobalt electrolyte contains less than 0.1mg/L, of divalent sulfur compounds; and
wherein the electroplated cobalt deposit is at least essentially free of chloride.

15. The electroplated cobalt deposit according to claim 14, wherein the cobalt electrolyte is at least substantially free of chloride ions.

16. The electroplated cobalt deposit according to claim 14, wherein the cobalt deposit contains less than 0.3 ppmw chloride as measured by secondary ion mass spectroscopy.

* * * * *